United States Patent [19]
Taga et al.

[11] Patent Number: 5,410,573
[45] Date of Patent: Apr. 25, 1995

[54] DIGITAL PHASE-LOCKED LOOP CIRCUIT

[75] Inventors: Noboru Taga; Tatsuya Ishikawa; Susumu Komatsu, all of Kanagawa, Japan

[73] Assignee: Kabushiki Kaisha Toshiba, Tokyo, Japan

[21] Appl. No.: 149,005

[22] Filed: Nov. 8, 1993

Related U.S. Application Data

[63] Continuation of Ser. No. 926,031, Aug. 5, 1992, abandoned.

[30] Foreign Application Priority Data

Aug. 7, 1991 [JP] Japan .................. 3-197788

[51] Int. Cl.$^6$ .............................................. H03D 3/24
[52] U.S. Cl. .................. 375/376; 375/327; 331/1 A; 331/25; 331/11
[58] Field of Search ................. 375/81, 120, 97; 331/1 A, 25, 10-12, 14; 307/510, 525, 526, 527, 528; 328/133, 134

[56] References Cited

U.S. PATENT DOCUMENTS

| | | | |
|---|---|---|---|
| 4,365,211 | 12/1982 | Lee ........................ | 375/120 |
| 4,534,044 | 8/1985 | Funke et al. ............ | 331/1 A |
| 4,797,635 | 1/1989 | Hatcher .................. | 331/17 |
| 4,814,719 | 3/1989 | Guyer ..................... | 375/120 |
| 4,862,104 | 8/1989 | Muratani et al. ........ | 331/1 A |
| 5,073,907 | 12/1991 | Thomas, Jr. ............ | 331/1 R |
| 5,079,519 | 1/1992 | Ashby et al. ............ | 307/511 |

FOREIGN PATENT DOCUMENTS 60-500192 2/1985 Japan ............................ H04B 14/04

OTHER PUBLICATIONS

T. Yagi, Y. Tanimoto, S. Otani, Y. Yoshizawa, H. Ohba & K. Kohno, "Development of Digital Demodulator LSI for Satellite Communication", Institute of Electronics, Information and Communication Engineering Conference, Fall 1990, pp. No. 2-174.

IEEE-IECEJ-ASJ International Conference on Acoustics, Speech, and Signal Processing ICASSP 86, 07.-11.04.1986, Tokyo, JP, vol. 3, pp. 2195-2198, New York, US; S. Ono et al.: 'Implementation of a New Type DSP PLL using High Performance DSP DSSP-1'*the whole document.

IEE Transactions on Communications vol. 22, No. 06, Jun. 1974, New York US pp. 751-764 J. Garodnick et al.: 'Response of an All Digital Phase-Locked Loop.' *p. 753, left-hand column, paragraph II.8: 'Phase Detector Distortion'*.

Patent Abstracts of Japan, vol. 016, No. 134 (E-1185) 6 Apr. 1992 & JP-A-32 96 322 (Fujitsu General Ltd.) 27 Dec. 1991 *abstract*.

Primary Examiner—Stephen Chin
Assistant Examiner—Don Vo
Attorney, Agent, or Firm—Limbach & Limbach; J. William Wigert, Jr.

[57] ABSTRACT

A digital phase locked loop which incorporates a phase comparator which produces a phase deviation signal having a sinusoidal phase comparison characteristic rather than a sawtooth phase comparison characteristic in order to avoid aliases.

4 Claims, 5 Drawing Sheets

DIGITAL PHASE-LOCKED LOOP CIRCUIT

This is a continuation of application Ser. No. 07/926,031, filed on Aug. 5, 1992 which is abandoned.

BACKGROUND OF THE INVENTION

1. Field of the Invention

The present invention generally relates to a digital phase-locked loop ("PLL") circuit, and more particularly, is directed to a digital PLL circuit for use in a carrier recovery system such as an M-ary phase shift keyed ("PSK") or quadrature amplitude modulated ("QAM") data communication system.

2. Description of the Prior Art

Much research on huge capacity digital data communication systems, e.g. video information transmission systems, has been recently developed and some systems have been marketed. In such digital data communication systems, M-ary PSK and QAM are used. These modulated systems use a digital PLL for obtaining a stable carrier recovered from the modulated data.

A conventional digital PLL circuit for processing complex number signals for such a purpose has been proposed, as shown in FIGS. 4 and 5.

FIG. 4A shows a block diagram of a conventional digital PLL circuit. Input terminals 20, 21 of a complex multiplier 22 accept a pair of complex in-phase (I) and quadrature (Q) data respectively which are converted into digital form.

The multiplier 22 also receives a sinusoidal signal ("Sin") and a cosinusoidal signal ("Cos"), both of which are provided from a data converter 26, and produces corresponding multiplication result signals: $I\cos\omega - Q\sin\omega$ and $I\cos\omega + Q\sin\omega$.

The phase comparator 23 receives the multiplication result signals and calculates the tangent characteristic based on the real and imaginary parts of the supplied multiplication inputs, and detects the phase $\theta_D$ in using the arctangent characteristic, which is derived from the aforementioned tangent characteristic, according to the following formula:

$$\theta_D = \arctan(Q/I) = \tan^{-1}(Q/I) \quad \text{(i)}$$

The phase comparator 23 determines the phase deviation $\Delta\theta$ of the detected phase $\theta_D$ from a preselected phase $\theta_R$, and outputs a phase deviation signal in proportion to the phase deviation. The phase deviation signal is fed to a PLL loop filter 24.

This phase deviation signal is also fed to a demodulation circuit (not shown in FIG. 4A) for use in data demodulation.

The phase deviation signal becomes a control variable for a numerical controlled oscillator 25 after passing through the PLL loop filter 24.

The output of the numerical controlled oscillator 25, a phase signal whose frequency is controlled by the control variable, is fed to a data converter 26.

The data converter 26 bifurcates the phase signal by converting it into the sinusoidal and cosinusoidal signals which are fed to the multiplier 22.

The above-mentioned completely digitalized loop circuit, which is comprised of the complex multiplier 22, phase comparator 23, PLL loop filter 24, numerical controlled oscillator 25 and data converter 26, can accomplish frequency acquisition and phase synchronizing.

FIG. 4B shows the phase comparison characteristic of the phase comparator 23. It is a sawtooth characteristic, i.e. a triangle wave detected by an arctangent characteristic (see formula (i)). In the process of frequency acquisition, according to the above phase comparison characteristic, the phase deviation signal from the phase comparator 23 should be a sampling signal, as shown in FIG. 5A, which can be acquired by sampling a sawtooth wave. Put another way, the phase deviation signal is a sampling sawtooth signal whose sampling frequency and frequency offset are $f_S$ and $\Delta f$, respectively. A sawtooth signal inherently possesses higher harmonics components. Therefore, the phase deviation signal has aliases caused by the higher harmonics, as shown in broken lines in FIG. 5B. Frequency acquisition can be accomplished by using the DC component, which represents the phase deviation $\Delta\theta$, of the output of the loop filter 24. However, aliases caused by the higher harmonics cancel the useful DC component. As a result, the digital PLL circuit is not able to accomplish frequency acquisition and locks onto an incorrect frequency. This phenomenon is called "false lock."

Therefore, if the conventional PLL circuit shown in FIG. 4A has a sawtooth phase comparison characteristic, it cannot accomplish phase synchronization via frequency acquisition because of the occurrence of false lock in the course of frequency acquisition.

Conventional digital PLL circuits, such as that described above having the sawtooth phase comparison characteristic of the phase comparator, have been restricted in their range of frequency acquisition because of the presence of the aliases caused by the higher harmonics.

OBJECTS AND SUMMARY OF THE INVENTION

Accordingly, it is an object of the present invention to provide a new and improved digital PLL circuit which does not exhibit false locking on aliases and has a sufficiently wide range of frequency acquisition, i.e. a wide "pull-in range."

In accordance with the present invention there is provided a digital PLL circuit to process input complex number signals comprising: a complex multiplier which multiplies the input complex number signals by sinusoidal and cosinusoidal signals as carriers; a phase comparator which detects a phase deviation based on a sinusoidal comparison characteristic in view of the output of the multiplication results from the multiplier; a loop filter which makes the output of a phase deviation signal whose characteristic is sinusoidal from the comparator a control variable; a numerical controlled oscillator which outputs a phase signal whose oscillating frequency is controlled by the control variable; and a converter which converts the phase signal into the sinusoidal and cosinusoidal signals which are fed to the multiplier as carriers.

DETAILED DESCRIPTION OF THE PREFERRED EMBODIMENTS

Figure 1:
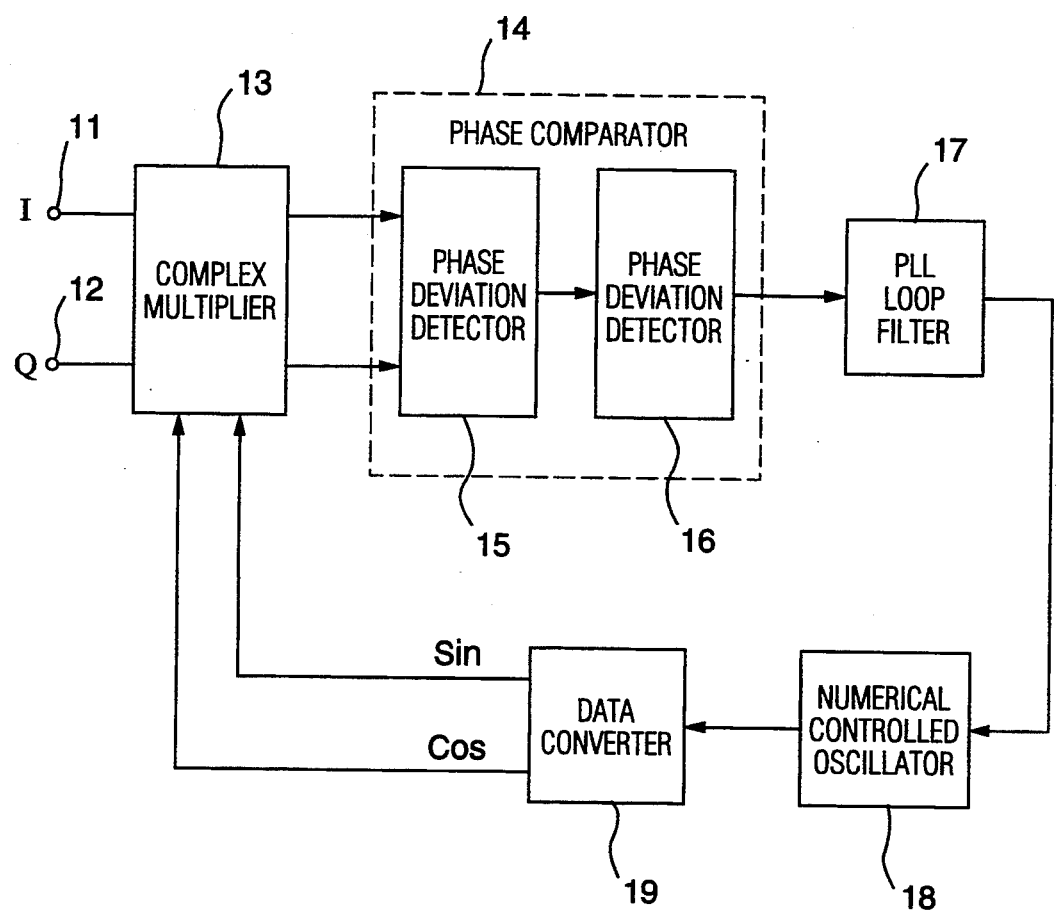
FIG. 1 is a block diagram of one embodiment of the invention.

FIG. 1 is a block diagram of one embodiment of the invention, i.e. a digital PLL circuit for processing complex number signals. Input terminals 11, 12 accept a pair of in-phase (I) and quadrature (Q) data which have been converted into digital complex form. These I and Q data are supplied to a complex multiplier 13.

The complex multiplier 13 also receives a sinusoidal signal and a cosinusoidal signal from a data converter 19, and supplies the outputs of the multiplication results (Icosω−Qsinω and Icosω+Qsinω) to a phase comparator 14.

A phase deviation detector 15 in the phase comparator 14 calculates the tangent characteristic using the real and imaginary parts of the supplied multiplication results, and detects the phase by using the arctangent characteristic which is derived from the aforementioned tangent characteristic. Then the phase deviation detector 15 determines the phase deviation from the detected phase and a preselected phase. The output of this phase deviation is fed to a phase deviation converter 16. The phase deviation converter 16 converts the supplied phase deviation into a phase deviation signal having a sinusoidal characteristic. This phase deviation signal is fed to a PLL loop filter 17. This phase deviation signal is also fed to a demodulation circuit (not shown in FIG. 1) for use in data demodulation.

The phase deviation signal becomes a control variable for a numerical controlled oscillator 18 after passing through the PLL loop filter 17.

The oscillator 18 produces a phase signal whose frequency is controlled by the control variable, and supplies it to the data converter 19. The converter 19 bifurcates the phase signal by converting it into the sinusoidal and cosinusoidal signals which are fed to the complex multiplier 13.

The above-mentioned completely digitalized loop circuit comprising the complex multiplier 13, phase comparator 14, PLL loop filter 17, numerical controlled oscillator 18 and data converter 19 can accomplish frequency acquisition and phase synchronizing.

Figure 2A:
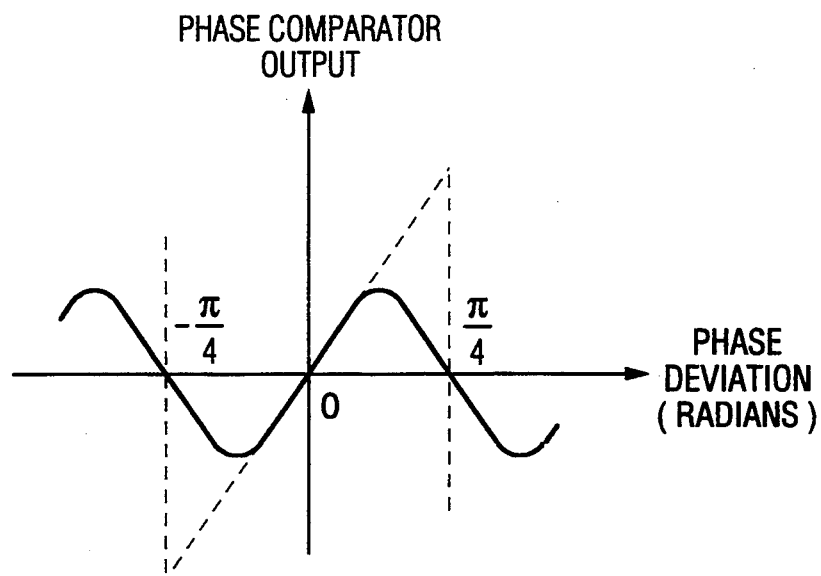
FIGS. 2A and 2B are graphs of the phase comparison characteristic and the phase deviation signal, respectively, of the phase comparator 14 shown in FIG. 1.
Figure 2B:
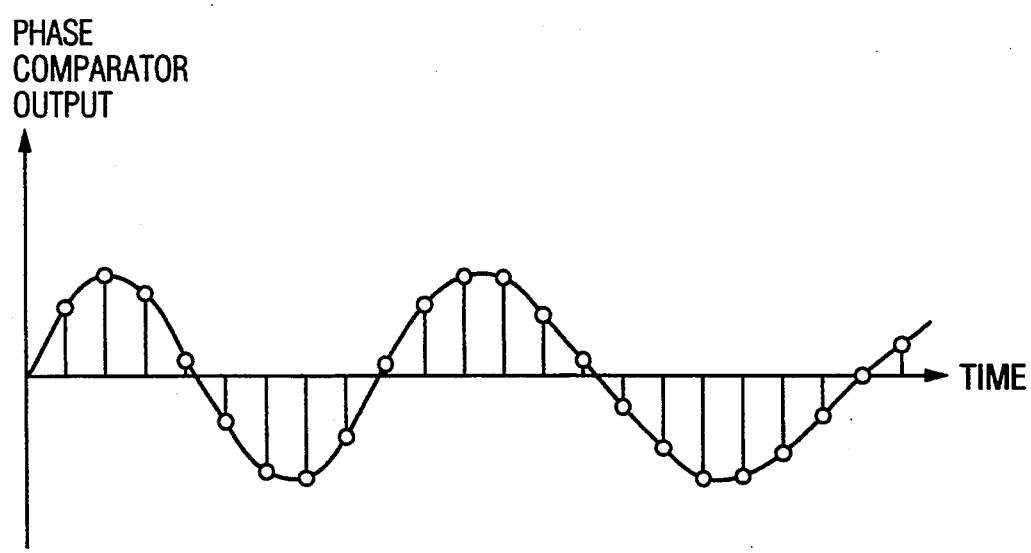

The phase comparison characteristic of the phase comparator 14 in this embodiment is sinusoidal, as shown in FIG. 2A (solid line). Hence, the phase deviation signal outputted from the phase comparator 14 is equal to sampling data which is acquired by sampling the sinusoidal wave signal as shown in FIG. 2B in the process of frequency acquisition, and has no aliases caused by sampling therein. A conventional PLL circuit has a sawtooth phase comparison characteristic and has higher harmonics, and therefore produces aliases caused by the higher harmonics. But the phase comparison characteristic of the invention has no higher harmonics components. Thus, the PLL circuit according to the invention does not experience false lock and generates no unnecessary DC component which prevents the normal action of the PLL.

The structure of the round loop made by the above-mentioned digital PLL circuit is a completely digital structure, and if the loop filter 17 is an ideal perfect integrator circuit, then in principle the invention PLL circuit has an infinite frequency acquisition range. This invention is not restricted to the above embodiment.

Figure 3:
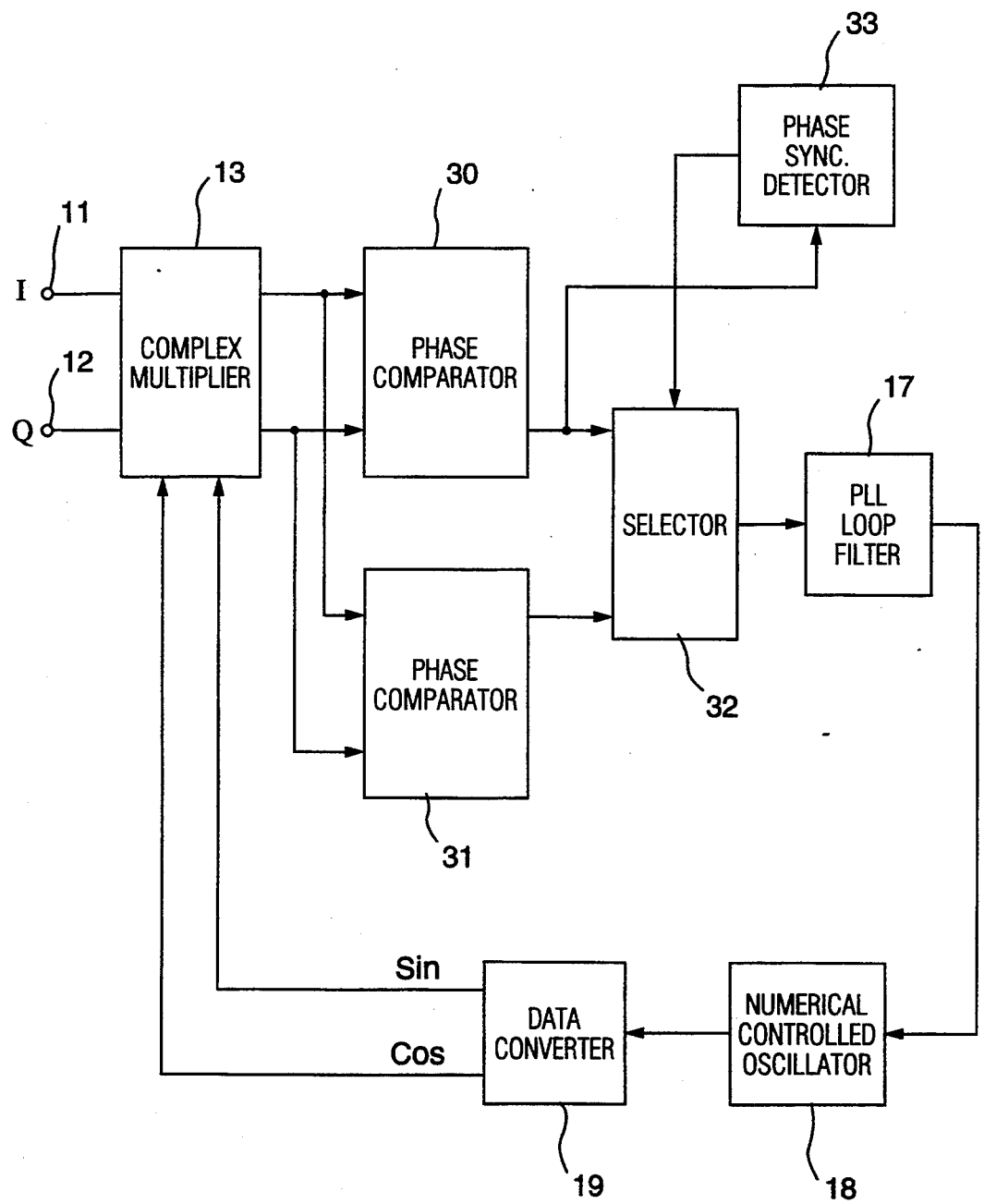
FIG. 3 is a block diagram of another embodiment of the invention.

FIG. 3 shows another embodiment of this invention, with the same parts as in FIG. 1 having the same reference numbers. In this embodiment the outputs of the complex multiplier 13 are supplied in parallel to a first phase comparator 30 whose phase comparison characteristic is sinusoidal and a second phase comparator 31 whose phase comparison characteristic is a sawtooth. Phase deviation signals from each phase comparator 30, 31 are fed to a selector 32. The control terminal of the selector 32 accepts a switching signal from a phase synchronizing detector 33. The selector 32 outputs one of the two phase deviation signals from the phase comparators 30, 31 according to the switching signal.

Figure 4A:
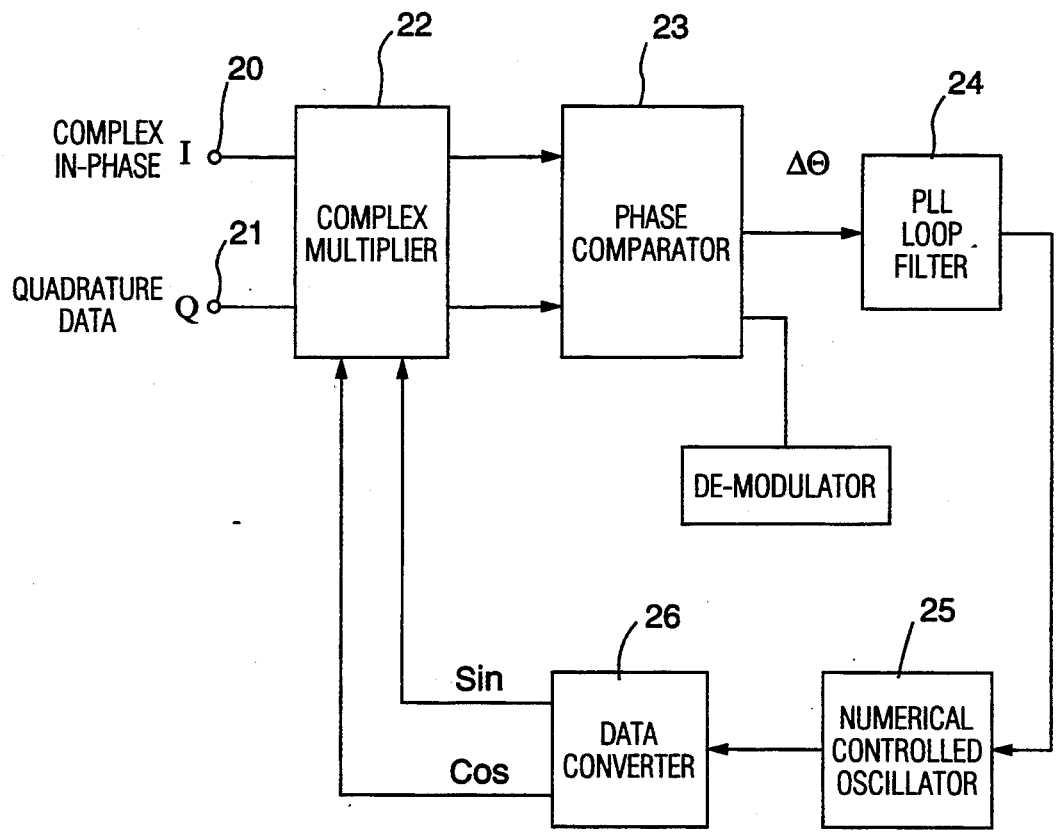
FIG. 4A is a block diagram of a conventional digital PLL circuit.
Figure 4B:
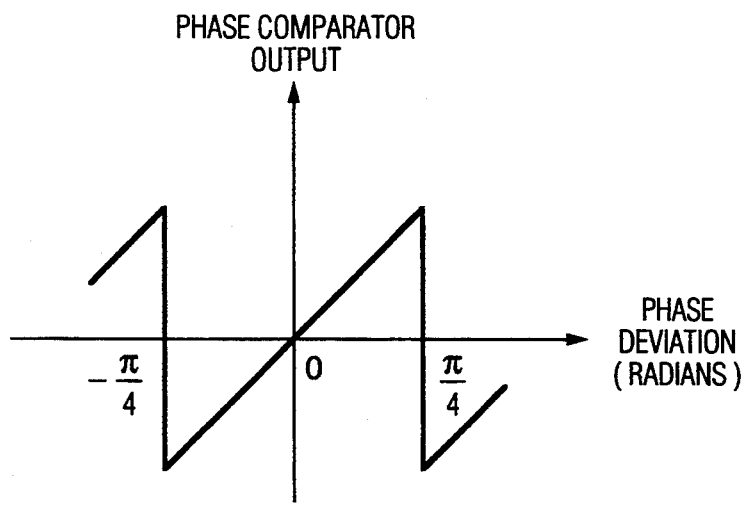
FIG. 4B is a graph of the phase comparison characteristic of the PLL circuit shown in FIG. 4A.
Figure 5A:
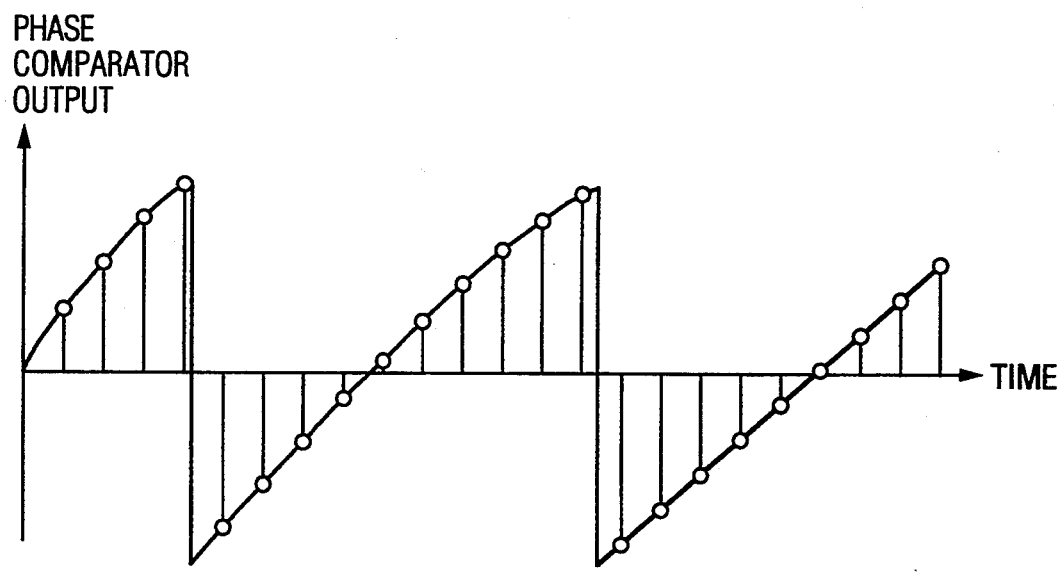
FIGS. 5A and 5B are graphs of the phase deviation signal for explaining the problem of the conventional PLL circuit shown in FIG. 4A.
Figure 5B:
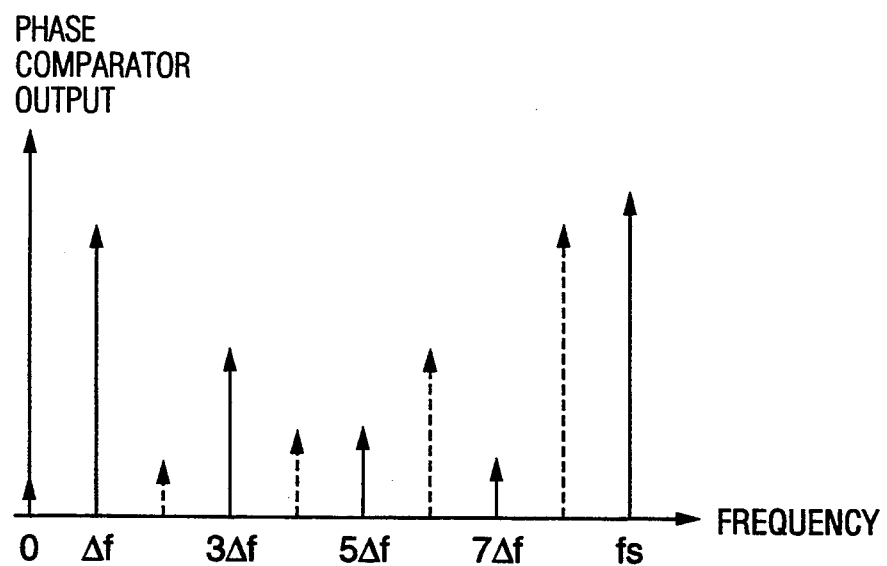

The switching signal of the synchronizing detector 33 selects the first phase comparator's 30 deviation signal whose characteristic is sinusoidal when the digital PLL circuit is in the process of frequency acquisition, and selects the second phase comparator's 31 deviation signal whose characteristic is a sawtooth when the digital PLL circuit is in the phase synchronizing state. The synchronizing detector 33 accepts the phase deviation signal of the first phase comparator 30, watches the phase synchronizing state and detects whether the condition is frequency acquisition or phase synchronizing. Therefore, when the PLL is in a frequency acquisition state, the selector 32 outputs the sinusoidal phase deviation signal of the first phase comparator 30 to the PLL loop filter 17. The PLL then experiences no false lock caused by aliases of higher harmonics and can have a wide "pull-in range". On the other hand, when the PLL is in a phase synchronizing state, the selector 32 outputs the sawtooth phase deviation signal of the second phase comparator 31. The PLL then has a larger phase margin against loop noise within the PLL than when using the aforementioned sinusoidal deviation signal, e.g. $\pm \pi/4$ (FIG. 4B) versus $\pm \pi/8$ (FIG. 2A).

As mentioned above, the embodiment shown in FIG. 3 can eliminate false lock caused by aliases of higher harmonics, and present a wide "pull-in range" by activating the sinusoidal characteristic comparator when the PLL is in a frequency acquisition state. On the other hand, after getting settled in a phase synchronizing state, the embodiment switches the comparator characteristic to a sawtooth and has a larger phase margin against loop noise within the PLL than with the sinusoidal comparison characteristic.

According to the invention, there are no aliases of the deviation signal or false locking, and the "pull-in range" of the digital PLL circuit can be substantially broadened.

What is claimed is:

1. A digital phase-locked loop (PLL) circuit for processing input complex number signals comprising:
   complex multiplier means for receiving and multiplying input complex number signals by a sinusoidal signal and a cosinusoidal signal as carrier signals and producing corresponding multiplication result signals;
   phase comparator means supplied with the multiplication result signals for detecting the difference in phase between the multiplication result signals and a preselected phase and producing a corresponding phase deviation signal having a sinusoidal characteristic;

loop filter means supplied with the phase deviation signal for producing a corresponding control signal;

numerical controlled oscillator means supplied with the control signal for generating an output phase signal whose oscillating frequency is controlled by the control signal;

converter means supplied with the output phase signal for converting the output phase signal into the sinusoidal signal and the cosinusoidal signal as the carrier signals; and wherein said phase comparator means comprises phase detector means for detecting a phase of the multiplication result signals by determining a real part and an imaginary part of the multiplication result signals, calculating a tangent characteristic from the real and imaginary parts, deriving an arctangent characteristic from the calculated tangent characteristic, detecting a phase from the arctangent characteristic, determining the difference between the detected phase and a preselected phase and producing the corresponding phase deviation signal, and a phase deviation converter means for converting the phase deviation signal, using a sinusoidal comparison characteristic, into the phase deviation signal having a sinusoidal characteristic.

2. A digital phase-locked loop (PLL) circuit for processing input complex number signals comprising:

complex multiplier means for receiving and multiplying input complex number signals by a sinusoidal signal and a cosinusoidal signal as carrier signals and producing corresponding multiplication result signals;

phase comparator means, whose phase comparison characteristic is selectable between a sinusoidal characteristic or a linear characteristic in accordance with a received changing signal, which is supplied with the multiplication result signals for detecting a difference in phase between the multiplication result signals and a preselected phase based on a phase comparison characteristic selected by the changing signal, and producing a corresponding phase deviation signal having either a sinusoidal characteristic or a sawtooth characteristic as determined by the changing signal;

loop filter means supplied with the phase deviation signal for producing a corresponding control signal;

numerical controlled oscillator means supplied with the control signal for generating an output phase signal whose oscillating frequency is controlled by the control signal;

converter means supplied with the output phase signal for converting it into the sinusoidal signal and the cosinusoidal signal as the carrier signals; and synchronizing detector means connected to the phase comparator means for detecting whether the PLL circuit is in a frequency acquisition state or a phase synchronizing state and generating the changing signal which causes the phase comparator means to output a phase deviation signal having a sinusoidal characteristic when the PLL circuit is in the frequency acquisition state and to output a phase deviation signal having a sawtooth characteristic when the PLL circuit is in the phase synchronizing state.

3. A digital PLL circuit according to claim 2 wherein the phase comparator means comprises:

first phase comparator means supplied with the multiplication result signals and having a sinusoidal phase comparison characteristic for producing a first phase deviation signal having a sinusoidal characteristic;

second phase comparator means supplied with the multiplication result signals and having a sawtooth phase comparison characteristic for producing a second phase deviation signal having a sawtooth characteristic; and selector means controlled by the changing signal and supplied with the first phase deviation signal and the second phase deviation signal for selecting between the first phase deviation signal and the second phase deviation signal as a function of the changing signal.

4. A digital PLL circuit according to claim 3 wherein the synchronizing detecting means is supplied with and uses the first phase deviation signal to determine whether the PLL circuit is in the frequency acquisition state or the phase synchronizing state.

* * * * *